United States Patent
Wang et al.

(10) Patent No.: US 10,148,796 B2
(45) Date of Patent: Dec. 4, 2018

(54) CHECKSUM FRIENDLY TIMESTAMP UPDATE

(71) Applicant: Telefonaktiebolaget L M Ericsson (publ), Stockholm (SE)

(72) Inventors: Patrick Wang, Palo Alto, CA (US); Daniel Christian Biederman, Saratoga, CA (US); Ravi Tangirala, San Jose, CA (US); Edward Ho, Fremont, CA (US); Afshin Ganjooi, Fremont, CA (US)

(73) Assignee: TELEFONAKTIEBOLAGET LM ERICSSON (PUBL), Stockholm (SE)

( * ) Notice: Subject to any disclaimer, the term of this patent is extended or adjusted under 35 U.S.C. 154(b) by 134 days.

(21) Appl. No.: 14/918,296

(22) Filed: Oct. 20, 2015

(65) Prior Publication Data
US 2017/0111483 A1    Apr. 20, 2017

(51) Int. Cl.
*H04L 29/06* (2006.01)
*H04L 12/26* (2006.01)
(Continued)

(52) U.S. Cl.
CPC ........ *H04L 69/164* (2013.01); *H03M 13/096* (2013.01); *H04J 3/067* (2013.01);
(Continued)

(58) Field of Classification Search
None
See application file for complete search history.

(56) References Cited

U.S. PATENT DOCUMENTS 5,842,216 A * 11/1998 Anderson ............. H04L 1/1678
6,252,891 B1 * 6/2001 Perches ................ H04J 3/0632
                                                          370/218
(Continued)

FOREIGN PATENT DOCUMENTS

WO     03003630 A1     1/2003

OTHER PUBLICATIONS

IEEE 1588-2008: "IEEE Standard for a Precision Clock Synchronization Protocol for Networked Measurement and Control Systems," Institute of Electrical and Electronics Engineers, Inc., Instrumentation and Measurement Society, Jul. 24, 2008, 289 pages.
(Continued)

*Primary Examiner* — George C Atkins
(74) *Attorney, Agent, or Firm* — NDWE, LLP

(57) ABSTRACT

A network device in a network is provided that is configured to implement a process for modifying a timestamp in a packet that is a timing protocol packet. The timing protocol packet is encapsulated by a user data protocol (UDP) datagram, where the modified timestamp is written into the packet, but does not require a checksum of the UDP datagram to be changed. The process includes receiving a packet including a first timestamp over the network, receiving the first timestamp from the packet and a second timestamp to be written to the packet, and determining a third timestamp that is a modification of the second timestamp to be written to the packet, the third timestamp having least significant bits modified from the second timestamp such that the checksum of the UDP datagram is unchanged. The process writes the third timestamp into the packet and transmits the UDP datagram to the network.

18 Claims, 6 Drawing Sheets

(51) Int. Cl.
*H04L 29/08* (2006.01)
*H04L 12/801* (2013.01)
*H03M 13/09* (2006.01)
*H04J 3/06* (2006.01)
*H04L 1/00* (2006.01)

(52) U.S. Cl.
CPC .......... H04J 3/0673 (2013.01); H04L 1/0061 (2013.01); H04L 43/106 (2013.01); H04L 47/12 (2013.01); H04L 69/324 (2013.01)

(56) References Cited

U.S. PATENT DOCUMENTS

| 8,948,037 | B1* | 2/2015 | Mizrahi | H04J 3/0673 370/252 |
|---|---|---|---|---|
| 2005/0286564 | A1* | 12/2005 | Hatley | H04L 43/106 370/503 |
| 2006/0088060 | A1* | 4/2006 | Fujikami | H04L 1/0041 370/474 |

OTHER PUBLICATIONS

RFC 768: Postel, J., "User Datagram Protocol," Internet Standard, Aug. 28, 1980, 3 pages.

RFC 958: Mills, D.L., "Network Time Protocol (NTP)," Network Working Group, Request for Comments, Sep. 1985, 15 pages.

RFC 1071: Braden, et al., "Computing the Internet Checksum," Network Working Group, Request for Comments, Sep. 1988, 24 pages.

RFC 1141: Mallory, et al., "Incremental Updating of the Internet Checksum," Network Working Group, Request for Comments, Jan. 1990, 2 pages.

RFC 1305: Mills, David L., "Network Time Protocol (Version 3), Specification, Implementation and Analysis," Network Working Group, Request for Comments, Mar. 1992, 120 pages.

RFC 1624: Rijsinghani, A., "Computation of the Internet Checksum via Incremental Update," Network Working Group, Request for Comments, May 1994, 6 pages.

RFC 5357: Hedayat, et al., "A Two-Way Active Measurement Protocol (TWAMP)," Internet Engineering Task Force, Network Working Group, Request for Comments, Oct. 2008, 26 pages.

Mizrahi, T., "UDP Checksum Trailer in OWAMP and TWAMP, draft-ietf-ippm-checksum-trailer-00.txt," Internet Engineering Task Force (IETF), Network Working Group, Internet Draft, Dec. 17, 2014, 11 pages.

Mizrahi, T., "Using UDP Checksum Trailers in the Network Time Protocol (NTP), draft-ietf-ntp-checksum-trailer-01.txt," Internet Engineering Task Force (IETF), NTP Working Group, Internet Draft, Jan. 15, 2015, 10 pages.

* cited by examiner

CHECKSUM FRIENDLY TIMESTAMP UPDATE

FIELD

Embodiments of the invention relate to the field of processing user datagram protocol (UDP) datagrams. Specifically, the embodiments relate to the modification of the payload of a UDP datagram in a manner that preserves a current checksum for the UDP datagram.

BACKGROUND

In several timing related protocols such as the Institute of Electrical and Electronics Engineers (IEEE) 1588 precision time protocol (PTP), network time protocol (NTP), one way active measurement protocol (OWAM) and two way active measurement protocol (TWAMP), the packet needs to be modified to replace a time value such as a timestamp or correction field. The packets of these protocols are often encapsulated by a UDP datagram, which requires that the UDP checksum be updated (or in the case of Internet Protocol (IP) v4 set to zero leaving the UDP payload unprotected).

A timestamp is a value that represents a moment in time that an associated data structure, like a packet, can be associated with. The time utilized in the timestamp is maintained by a network device via software or hardware. The timestamp can have any format and can have any size. The larger the size (i.e., the greater the number of bits), the more accurate the time representation can be. A checksum is a value utilized to verify that the contents of a packet (or datagram) have not been corrupted or otherwise altered. A checksum function takes the packet itself or some subset of the packet as an input and generates a value from this input that can be recomputed at a destination of the packet to verify that the packet has not been altered. In the case of UDP, a checksum is computed by a ones complement sum of the 16 bit representations of a subset of the header (e.g., omitting the checksum value) and the payload.

Calculating the checksum in UDP, using the basic algorithm, requires the buffering of the entire UDP datagram and involves a number of operations that increases with the size of the UDP datagram. As a result, the updating of a UDP datagram can require significant computational resources and induce significant latency to the transmission of the UDP datagram. Also, buffering the entire UDP datagram increases the resources required to process the UDP datagram, because the UDP datagrams can have a significant size, a buffer of commensurate size must be available.

PTP, NTP, OWAMP and TWAMP update timestamps as part of their protocol at the time that the PTP, NTP, OWAMP or TWAMP packet is transmitted and/or received at the network device. Some of these protocols include multiple timestamps for receiving times, transmission times and similar information. These timestamps are inserted or updated often just before the transmission or just after the receipt of the packets at a network device. Altering the timestamps in these packets causes the checksum of the encapsulating UDP datagram to be invalid and as a result the UDP datagram checksum must be updated. In some implementations, in particular for IPv4, the checksum may be set to zero, indicating that it is not being utilized. This is done rather than incur the overhead of updating the checksum. However, this leaves the UDP datagram open to corruption or alteration and it cannot be verified. In other embodiments, such as some IPv6 implementations, instead of recalculating the UDP checksum, a checksum trailer is appended to the UDP datagram. The checksum trailer is a data structure that includes additional information to identify the changes in the checksum that are to be taken into consideration when verifying the UDP datagram at the destination. The use of the checksum trailer avoids an entire recalculation of the UDP checksum but introduces additional overhead in adding and transmitting the checksum trailer.

Thus, the current implementations for the updating of timestamps or similar information in a UDP payload has a number of drawbacks or limitations. These implementations require that that the current checksum in the UDP header and/or checksum data in a checksum trailer be accessed. Arithmetic is then applied to this data to update the new checksum based on packet modifications (such as inserting/replacing a timestamp). Then the checksum in the UDP header or in the checksum trailer can be rewritten. When the UDP datagrams and modified fields in question get larger, and/or the fields are separated by other fields of data, this creates significant overhead for the process in terms of latency, computation and storage. An implementation must do read-modify-writes. This takes both time and storage, which thus adds complexity and lowers performance as well.

SUMMARY

In one embodiment, a network device in a network is provided that is configured to implement a process for modifying a timestamp in a packet that is a timing protocol packet. The timing protocol packet is encapsulated by a user data protocol (UDP) datagram, where the modified timestamp is written into the packet, but does not require a checksum of the UDP datagram to be changed. The process includes receiving a packet including a first timestamp over the network, receiving the first timestamp from the packet and a second timestamp to be written to the packet, and determining a third timestamp that is a modification of the second timestamp to be written to the packet, the third timestamp having least significant bits modified from the second timestamp such that the checksum of the UDP datagram is unchanged. The process writes the third timestamp into the packet and transmits the UDP datagram to the network.

In another embodiment, a network device in a network including a plurality of network devices, implements a method for modifying a timestamp in a packet that is a timing protocol packet that is encapsulated by a user data protocol (UDP) datagram. The modified timestamp is written into the packet, but does not require a checksum of the UDP datagram to be changed. The network device includes a machine-readable storage medium, and a processor coupled to the machine-readable storage medium. The processor is configured to receive the UDP datagram from the network, to receive the first timestamp from the packet in the UDP datagram and a second timestamp to be written to the packet, to write a third timestamp into the packet in the UDP datagram, and to transmit the UDP datagram to the network, and a checksum neutral modification module coupled to the processor and the machine-readable storage medium, the checksum neutral modification module configured to determine the third timestamp that is a modification of the second timestamp to be written to the packet, the third timestamp having least significant bits modified from the second timestamp such that the checksum of the UDP datagram is unchanged.

In a further embodiment, a non-transitory machine-readable medium has stored therein a set of instructions. When the set of instructions are executed by a network device, in a network of a plurality of network devices, the set of instructions implement a method for modifying a timestamp in a packet that is a timing protocol packet that is encapsulated by a user data protocol (UDP) datagram. The modified timestamp is written into the packet, but does not require a checksum of the UDP datagram to be changed. The set of instructions include receiving a packet including a first timestamp over the network, receiving the first timestamp from the packet and a second timestamp to be written to the packet, and determining a third timestamp that is a modification of the second timestamp to be written to the packet, the third timestamp having least significant bits modified from the second timestamp such that the checksum of the UDP datagram is unchanged. The set of instructions further include writing the third timestamp into the packet, and transmitting the UDP datagram to the network.

BRIEF DESCRIPTION OF THE DRAWINGS

The invention may best be understood by referring to the following description and accompanying drawings that are used to illustrate embodiments of the invention. In the drawings.

DESCRIPTION OF EMBODIMENTS

Figure 1A:
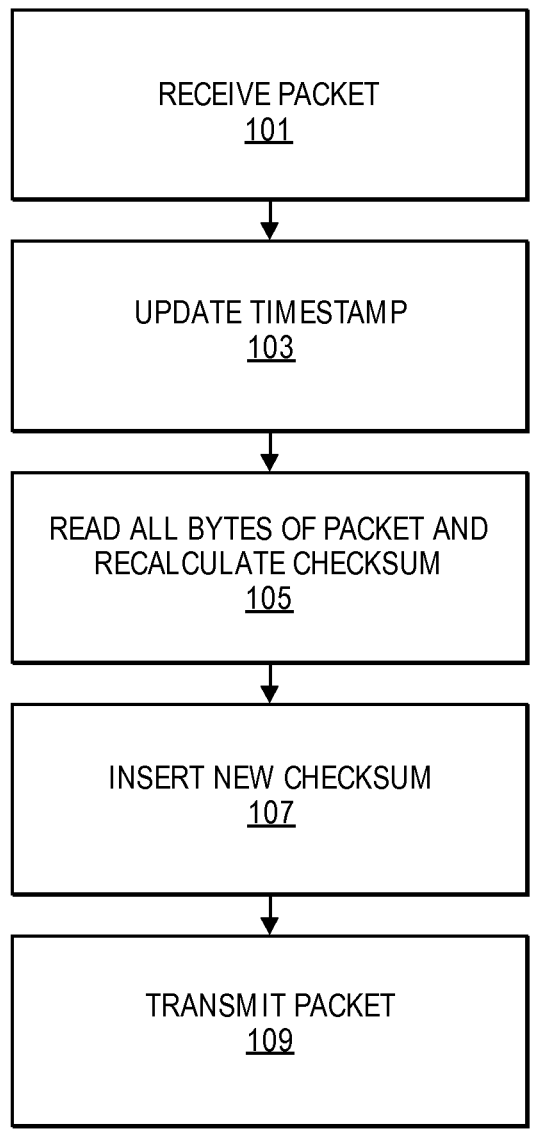
FIG. 1A is a flowchart of one embodiment of a basic checksum update process.

The following description describes methods and apparatus for updating a user datagram protocol (UDP) datagram in such a way that the modification does not require the recomputation of the UDP checksum. Further, the embodiments provide a process that does not require accessing the current UDP checksum, rather the modification to the UDP datagram (e.g., updating a timestamp) is carried out in such a manner that only the prior value to be modified is accessed and rewritten. This process can be carried out with only the buffering of the field to be modified and thereby reduces the overhead in terms of storage, latency and computational resources. The process makes use of a portion of the field to be rewritten to offset the changes in the rewrite in terms of the UDP checksum. The UDP checksum is a ones complement sum of a portion of the UDP header and payload. The embodiments determine the change to one portion of a rewritten field of the UDP payload and then offset this in a second portion of a rewritten field of the UDP payload. As a result, the UDP checksum does not need to be recomputed.

In the following description, numerous specific details such as logic implementations, opcodes, means to specify operands, resource partitioning/sharing/duplication implementations, types and interrelationships of system components, and logic partitioning/integration choices are set forth in order to provide a more thorough understanding of the present invention. It will be appreciated, however, by one skilled in the art that the invention may be practiced without such specific details. In other instances, control structures, gate level circuits and full software instruction sequences have not been shown in detail in order not to obscure the invention. Those of ordinary skill in the art, with the included descriptions, will be able to implement appropriate functionality without undue experimentation.

References in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

Bracketed text and blocks with dashed borders (e.g., large dashes, small dashes, dot-dash, and dots) may be used herein to illustrate optional operations that add additional features to embodiments of the invention. However, such notation should not be taken to mean that these are the only options or optional operations, and/or that blocks with solid borders are not optional in certain embodiments of the invention.

In the following description and claims, the terms "coupled" and "connected," along with their derivatives, may be used. It should be understood that these terms are not intended as synonyms for each other. "Coupled" is used to indicate that two or more elements, which may or may not be in direct physical or electrical contact with each other, co-operate or interact with each other. "Connected" is used to indicate the establishment of communication between two or more elements that are coupled with each other.

An electronic device stores and transmits (internally and/or with other electronic devices over a network) code (which is composed of software instructions and which is sometimes referred to as computer program code or a computer program) and/or data using machine-readable media (also called computer-readable media), such as machine-readable storage media (e.g., magnetic disks, optical disks, read only memory (ROM), flash memory devices, phase change memory) and machine-readable transmission media (also called a carrier) (e.g., electrical, optical, radio, acoustical or other form of propagated signals—such as carrier waves, infrared signals). Thus, an electronic device (e.g., a computer) includes hardware and software, such as a set of one or more processors coupled to one or more machine-readable storage media to store code for execution on the set of processors and/or to store data. For instance, an electronic device may include non-volatile memory containing the code since the non-volatile memory can persist code/data even when the electronic device is turned off (when power is removed), and while the electronic device is turned on that part of the code that is to be executed by the processor(s) of that electronic device is typically copied from the slower non-volatile memory into volatile memory (e.g., dynamic random access memory (DRAM), static random access memory (SRAM)) of that electronic device. Typical electronic devices also include a set or one or more physical network interface(s) to establish network connections (to transmit and/or receive code and/or data using propagating signals) with other electronic devices. One or more parts of an embodiment of the invention may be implemented using different combinations of software, firmware, and/or hardware.

A network device (ND) is an electronic device that communicatively interconnects other electronic devices on the network (e.g., other network devices, end-user devices). Some network devices are "multiple services network devices" that provide support for multiple networking functions (e.g., routing, bridging, switching, Layer 2 aggregation, session border control, Quality of Service, and/or subscriber management), and/or provide support for multiple application services (e.g., data, voice, and video).

Overview

FIG. 1A is a flowchart of one embodiment of a basic checksum update process. The illustrated process describes the basic process for updating a UDP checksum where the UDP datagram is modified. The examples provided herein relate to the update of a timestamp in the UDP payload and more specifically to the update of a timestamp in a timing protocol packet (e.g., a precision time protocol (PTP), network time protocol (NTP), one way active measurement protocol (OWAMP), or two way active measurement protocol (TWAMP) packet) that is encapsulated by the UDP datagram. One skilled in the art would understand that this example is provided by way of illustration and not limitations. The process and structures described herein as embodiments of the invention with relation to the update of timestamps can also be applied to other modifications to the payload of a UDP datagram where there is a portion of the modified payload that can be utilized for creating checksum neutral values that do not change the UDP datagram checksum. These portions of the payload would ideally be situated in a location adjacent to the areas to be modified and encompass bits that are not to be utilized for other purposes or that do not affect the operation of dependent processes. In the given examples involving timestamps, the least significant bits of a timestamp are modified to create the checksum neutral or 'friendly' timestamp to be written into the UDP payload, which is feasible because the least significant bits are either not relied upon or do not materially affect the operation of dependent processes. For example, OWAMP and TWAMP do not require the level of precision offered at the sub-nanosecond level of the least significant bits of the timestamp, thus, these least significant bits can be altered without adversely affecting OWAMP and TWAMP.

In many older systems the handling of the UDP checksum was implemented in an application specific integrated circuit (ASIC) that calculates the UDP checksum over the full packet (e.g., a portion of the header and the complete payload) and then replaces the checksum. This can be very difficult for a software implementation as it needs to calculate the checksum over all the bytes of the packet, before the packet can be transmitted. Storing the entire packet, which can be rather large requires significant storage space. Computing the checksum over the entire packet requires significant computational resources and creates delay (i.e., latency) to carry out the computation before the UDP datagram can be transmitted.

The process for updating a UDP datagram where for example a timestamp is updated (i.e., added, modified or otherwise changed) in the payload of the UDP datagram that may encapsulate a packet such as a PTP, NTP, OWAMP, TWAMP or similar packet can be initiated in response to receiving a packet (Block 101). The process can be implemented by a network device at the line card, network processor, processor, or similar location in the network device or distributed over these locations. The packet can be received incrementally and will be buffered until completely received. The timestamp or similar field in the UDP payload/encapsulated packet is then updated (Block 103). A single field may be updated or several fields may be updated. When such a modification is made, then the UDP checksum update process reads all of the bytes of the packet and recalculates the checksum (Block 105). This is done by a ones complement addition of each 16 bit section of the UDP datagram including a subset of the UDP header and the UDP payload. The recalculated UDP checksum is then inserted into the UDP header (Block 107) and the UDP datagram can then be transmitted (Block 109).

There are some additional variations and improvements on this process. Some variants on the basic UDP checksum calculation, such as that described in the Internet Engineering Task Force (IETF) Request for Comments (RFC) 1624 entitled "Computation of the Internet Checksum via Incremental Update," reduce the number of reads and calculations required on the UDP datagram. In this variant, the old checksum is read, the old timestamp is read, the new timestamp is written, the difference between the old and new timestamp is calculated to create a new checksum, the new checksum replaces the old checksum and the packet is transmitted. In a further variant described in IEEE 1588, the use of a checksum trailer is described to be used in place of updating the UDP checksum. This variant allows for a low latency media access control (MAC) layer to be transmitting a portion of the packet while updating the timestamp or correction value fields which come after the UDP checksum. Hence the MAC layer could have transmitted the UDP header including the UDP checksum, before or during the rewrite, because the relevant information to update the UDP checksum is stored in the checksum trailer at the end of the UDP datagram. Hence it can add or rewrite a checksum trailer at the end of the UDP datagram to make the original checksum correct. In this variant, an additional step may be needed to read the old checksum trailer and replace it.

The embodiments described herein, however overcome the disadvantages of the prior art described herein above by providing a process that enables the modification of a timestamp or similar field in the payload of a UDP datagram without requiring the overhead associated with handling a checksum trailer or recalculating the UDP checksum over the entire UDP datagram. The embodiments provide a process where only the timestamp field in the received UDP datagram needs to be read and written to. The embodiments do not require that the entire UDP datagram be buffered before transmitting it. Thus, the latency and computational resources are significantly reduced. The process modifies the update to the timestamp or similar field to ensure that the values that would be utilized in the calculation of the UDP checksum do not change the result of the UDP checksum computation. Thus, the update to the trailer is checksum neutral or friendly.

Figure 1B:
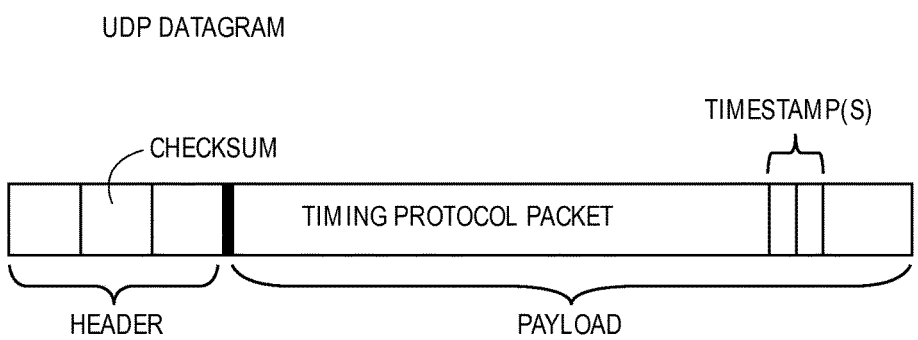
FIG. 1B is a diagram of an example UDP datagram encapsulating a timing protocol packet.

FIG. 1B is a diagram of an example UDP datagram encapsulating a timing protocol packet, such as an NTP, PTP, OWAMP or TWAMP packet. A UDP datagram can have a payload of any size. The UDP datagram format is described for illustrative purposes and is further defined in the IETF RFC 768 entitled "User Datagram Protocol." In the illustrated example, the UDP datagram includes a header that includes a checksum value amongst other data. The diagram is provided to illustrate those aspects of the UDP datagram that are most relevant to the embodiments. The UDP header and checksum are positioned at the head of the UDP datagram. If a checksum trailer were present it would be at the tail of the UDP datagram. Thus, when transmitting the UDP datagram in order, the UDP header is the first section to be transmitted, thereby requiring that the UDP header information including the checksum be completed before any transmission of the UDP datagram.

The UDP datagram also includes a payload. The payload can include any information, in this example the payload is the encapsulated packet having information therein to be modified. In this example, the payload is a timing protocol packet (e.g., an NTP, PTP, OWAMP or TWAMP packet) including a set of timestamp fields (i.e., at least one timestamp field). A 'set,' as used herein refers to any positive whole number of items, including one item. The timestamp fields are at a significant distance from the header. Thus, these fields may arrive later and be modified and processed many cycles after the UDP header has been received. If the only operation to be performed before forwarding the UDP datagram is to update the timestamp fields, then the retransmission can be delayed by tens or hundreds of cycles if the basic algorithm for a UDP checksum update process is used. However, if the update to the timestamp fields is performed in a checksum neutral or friendly manner as disclosed herein, then no delay is required and the processing of the UDP datagram is limited to reading and writing the timestamp fields. In addition, the computational requirements on the processor implementing this process are reduced because the computations to generate the checksum neutral value are significantly less than computing a checksum over an entire packet.

The operations in the below flow diagrams will be described with reference to the exemplary embodiments of the other figures. However, it should be understood that the operations of the flow diagrams can be performed by embodiments of the invention other than those discussed with reference to the other figures, and the embodiments of the invention discussed with reference to these other figures can perform operations different than those discussed with reference to the flow diagrams.

Figure 2:
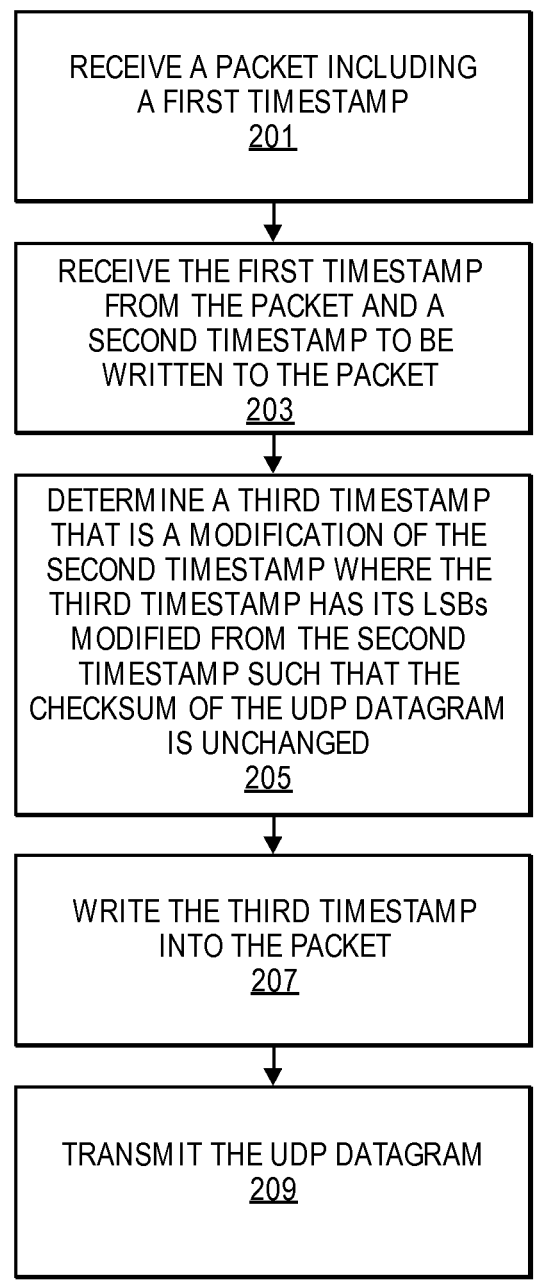
FIG. 2 is a flowchart of one embodiment of a process for updating a timestamp using a checksum friendly value.

FIG. 2 is a flowchart of one embodiment of a process for updating a timestamp using a checksum friendly value. In one embodiment, the process begins with the receipt of a UDP datagram in which a portion of the payload is to be modified (Block 201). In the example embodiment, the portion of the payload to be modified is a timestamp field in an NTP, PTP, OWAMP or TWAMP packet that is encapsulated by the UDP datagram. However, one skilled in the art would appreciate that the UDP datagram could encapsulate any timing protocol packet. NTP, PTP, OWAMP and TWAMP are provided by way of example and not limitation. Other types of timing protocols with similar timestamps can also be handled consistent with the principles and structures described herein. The field to be modified is then read, for example, by a checksum neutral modification module (Block 203). If the field to be modified is a timestamp field, then the timestamp field is accessed from the received UDP datagram payload. The retrieved field is examined to determine the ones complement values that would be part of the UDP checksum computation. A separate timestamp to be written to the timestamp field is also received, for example, as an input by the checksum neutral modification module. The two timestamps (i.e., the first timestamp received in the packet and the second timestamp being the timestamp to be written to the packet), or similar values, are used to calculate a third timestamp (i.e., a timestamp modified from the second timestamp) that is checksum neutral or friendly such that the checksum in the UPD header does not need to be changed (Block 205).

In one embodiment, the modification to the (second) timestamp to be written to the timestamp field of the packet is generated by modifying the least significant bits (LSBs) of the (second) timestamp to be written to the timestamp field such that the difference between the most significant bits in the new (second) timestamp and the received (first) timestamp are offset or negated by the modified least significant bits (i.e., in the third timestamp). In other embodiments, the offsetting is not between most significant and least significant bits but between the most relevant data and least relevant data, because the least relevant data or least significant bits can be inaccurate for the purposes of the encapsulated packet being transmitted. With this use of a portion of the timestamp field to make the entire timestamp field checksum neutral or friendly, there is no need to write or update a UDP header or checksum trailer. The process needs only to read the received timestamp field, and write a checksum neutral or friendly value back into the same field. In the case of a protocol like NTP or TWAMP, the 64-bit timestamp (i.e., first timestamp) is read from the received UDP datagram payload, the current/actual time (i.e., second timestamp) is also received as an input and modified (i.e., third timestamp) such that the top 48 most significant bits are preserved, and the 16 least significant bits are modified to make the overall 64-bit rewrite have the same checksum for the UDP datagram. There is a loss in accuracy, but for protocols like NTP and TWAMP, the extreme precision is not necessary.

Using this process it is easier (i.e., fewer computational and storage resources are required) for network device software to update the timestamp only, rather than to update the timestamp and UDP checksum or UDP checksum trailer. There are many ways that a UDP datagram and the encapsulated packet can be updated to make the checksum pass, i.e., such that the update is checksum neutral or friendly. Hence the embodiments can be compatible with any number of the multiple possible checksum updates to make the timestamp update more accurate (i.e., try to match the upper bits) by modifying differing numbers of bits. In some embodiments, a rewritable field (such as a timestamp field) may be extended such that the rewrite value is checksum friendly.

A simple example can illustrate a method for making the checksum neutral modification. In this example, decimal representations of the values of each byte or similar portion of a UDP datagram are used, rather than the standard ones complement representation for sake of convenience.

In a simplified generic example for sake of clarity, a datagram can be received with 20 bytes encoding 10 values (i.e., each value having two bytes) including the values 25, 11, 12, 7, 0, 0, 0, 0, 13, and 4. The four values of 0 are the timestamp field to be modified. In this example, the timestamp to be written is 6, 2, 5, and 1, the first two timestamp values are then rewritten with 6 and 2. The checksum in this example is assumed to be calculated by adding the values then dividing by a predetermined number, 16 for this generic example. The initial sum is 72 with a remainder of 8 that serves as the checksum value. If the two values of 6 and 2 are added then the remaining values of 5 and 1 may need to be modified to ensure that the remainder stays the same. Thus, the values of 5 and 3 can be input, which alters the sum to 80 but keeps the remainder at 8, which is the checksum value. Different combinations of values could have been written in the last two timestamp locations, but in this example a greater accuracy was achieved by keeping the 5 value and only modifying the 1 value. In other embodiments, a similar analysis can be carried out to minimize loss in accuracy of the timestamp. The general example of a datagram having 20 bytes is given for sake of simplicity and clarity, one skilled in the art would understand that a UDP datagram may be significantly larger than 20 bytes and different mathematical algorithms may be utilized in computing checksum values while remaining consistent with the principles, processes and structures of the embodiments described herein.

Returning to the process of FIG. 2, after the modifications to the (second) timestamp to be inserted into the UDP datagram payload have been determined, then the process can rewrite the timestamp field using the modified (third) timestamp (Block 207). This processing of the timestamp field does not delay the transmission of the overall UDP datagram and once the timestamp field has been modified the complete transmission of the UDP datagram can complete (Block 209).

Figure 3:
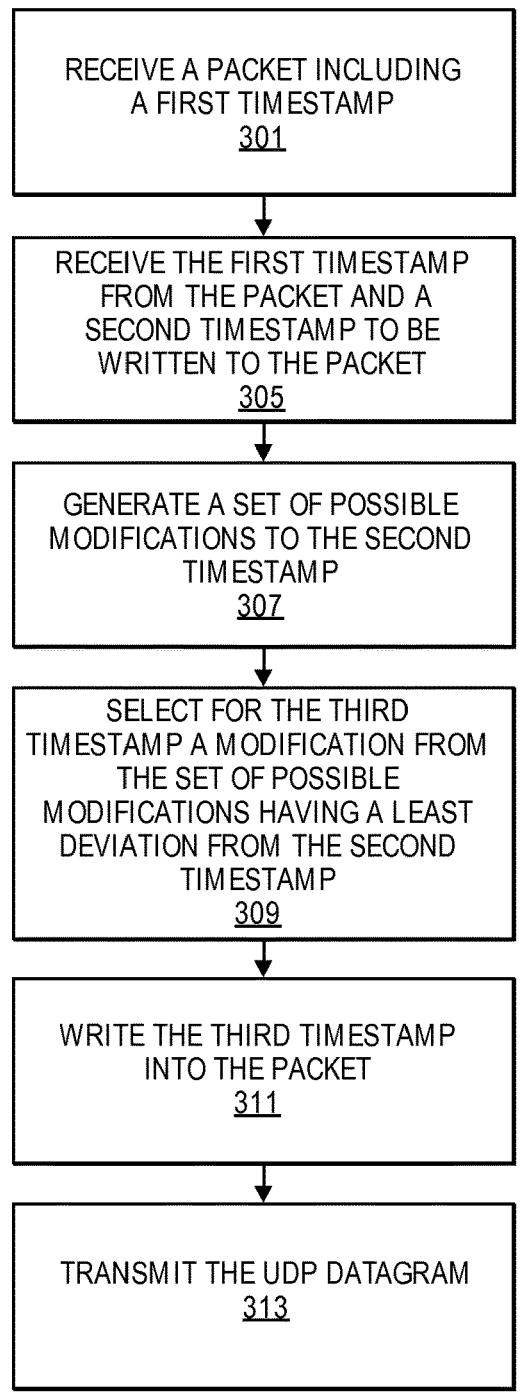
FIG. 3 is a flowchart of another embodiment of a process for updating a timestamp using a checksum friendly value.

FIG. 3 is a flowchart of another embodiment of a process for updating a timestamp using a checksum neutral or friendly value. In this embodiment, the process is adjusted to take into consideration a variation on the number of bits in the timestamp to be modified. The process begins with the receipt of the UDP datagram including an encapsulated packet such as a PTP, NTP, OWAMP or TWAMP packet including at least one timestamp field or similar field (Block 301). The relevant (first) timestamp field is read from the received packet and input into, for example, the checksum neutral modification module (Block 305). The current/actual (second) timestamp is also provided as an input from a system clock or similar source.

A set of possible modifications for checksum neutral or friendly values can then be computed using the two input timestamps (Block 307). Any process can be utilized to identify the set of possible modifications for checksum neutral values. A comparison of the received (first) timestamp and the actual/current (second) timestamp reveals the difference that needs to be compensated or offset. For example, if the most significant bits alter a ones complement sum by a value of 4 then the least significant bits may need to offset this value by a reduction of 4. This could be accomplished with various permutations by altering any number of bits or combination of bits in the least significant bits. The process generates the possible modifications and then analyzes the set of possible modifications to determine which one preserves the greatest accuracy by deviating the least from the actual/current (second) timestamp (e.g., alters the fewest or least significant bits) (Block 309). Stated more broadly, given a K bit timestamp and an N bit checksum, where K>N, the process can manipulate no more than a lower N bits of the timestamp so that the K bit timestamp only loses accuracy of at most the lower N bits and leaves the remainder of the timestamp unchanged. Likewise it is possible to designate a set of bits or a separate field to be utilized as a checksum neutral or friendly location to make it easier to implement the process without degrading precision or accuracy. This embodiment may require a change to the format of the packet. The option that preserves the greatest accuracy can be selected and utilized where the (third) timestamp with the selected modification is written into the timestamp field of the UDP payload encapsulated packet (Block 311). The complete UDP datagram can then be transmitted (Block 313).

The embodiments discussed herein above for generating a checksum neutral value may be utilized where a receiver of the UDP diagram and the timing protocol packet are not aware of the modification being made to the timestamps. The modifications are generally related to the least significant bits of the timestamps thus the accuracy of the timestamps is minimally if at all affected, because in many cases the receiver does not utilize the level of precision in timing tied to the least significant bits. In other embodiments, a receiver of the modified timestamps may be aware or made aware of the modification. The receiver can be notified or identify packets with modified timestamps using the checksum neutral process via a separate notification, a negotiation or handshake phase of a related protocol, a global network setting, a local setting, a value in the received UDP datagram, or via similar process. In such cases, the receiver can ignore the modifications, reverse the modifications, mitigate the modifications (e.g., by rounding or ignoring the least significant bits) or similarly handle the modified timestamps.

Figure 4:
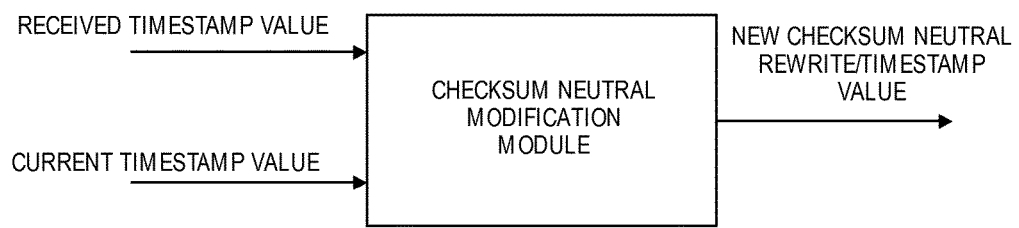
FIG. 4 is a diagram of one embodiment for a checksum neutral modification module.

FIG. 4 is a diagram of one embodiment for a checksum neutral modification module. The checksum neutral modification module can be a hardware component such as an application specific integrated circuit (ASIC), an algorithm implemented by a network processor or general purpose processor or similarly implemented component. In some embodiments, the checksum neutral modification module is implemented close to the port or transmission medium such that timestamps can be modified as close to the time of actual receipt or transmission, such as in an ASIC on a line card in a network device. The output modified timestamp can be written directly to the UDP datagram or can be provided to another component that will update the UDP datagram. In other embodiments, the checksum neutral modification module can be implemented as a set of separate components that implement any combination of the individual steps of the process described herein above.

Figure 5:
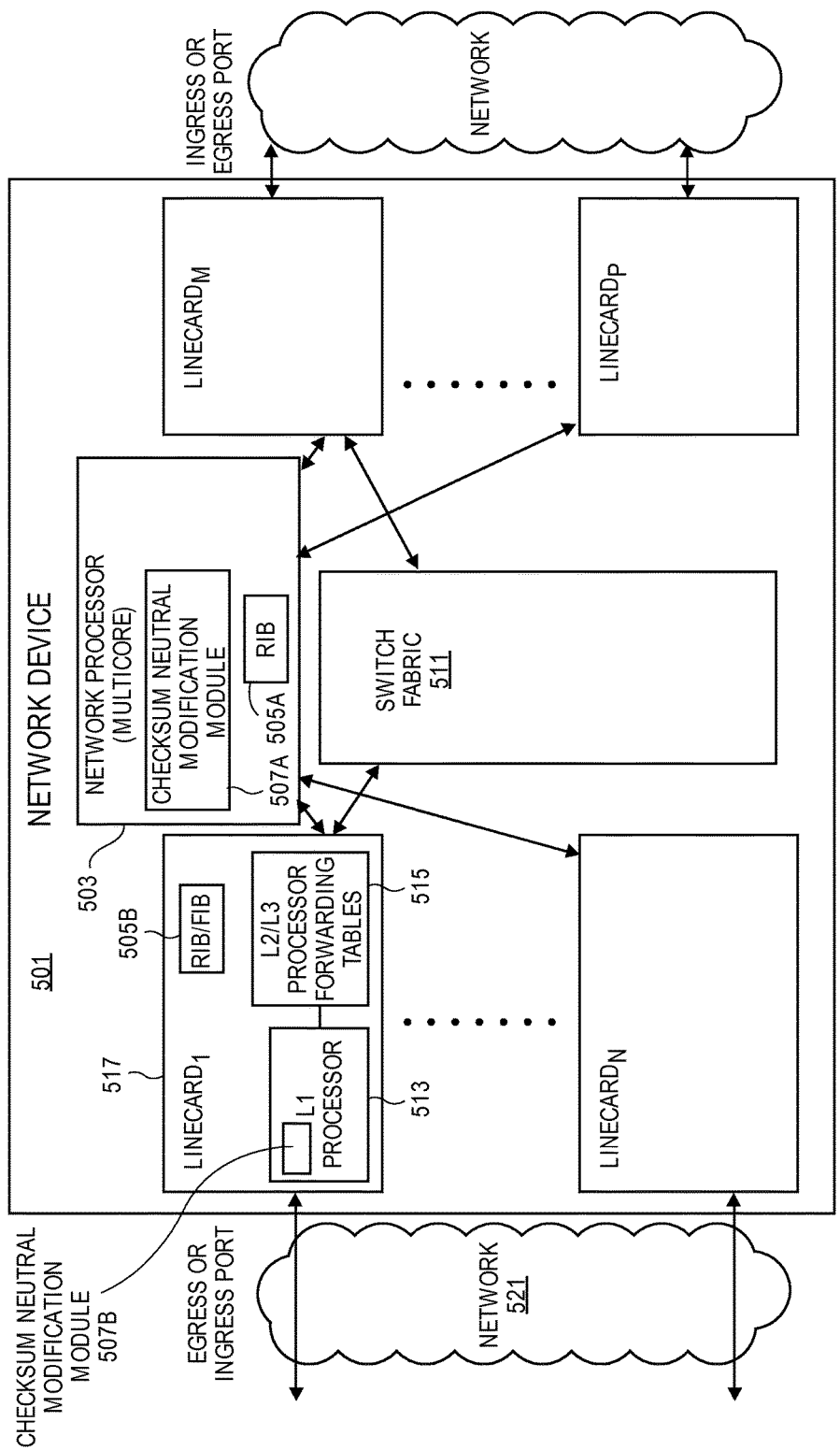
FIG. 5 is a diagram of one embodiment of a network device that includes at least one checksum neutral modification module.

FIG. 5 is a diagram of one embodiment of a network device implementing the checksum neutral modification process and system. A network device (ND) is an electronic device that communicatively interconnects other electronic devices on the network (e.g., other network devices, end-user devices). Some network devices are "multiple services network devices" that provide support for multiple networking functions (e.g., routing, bridging, switching, Layer 2 aggregation, session border control, Quality of Service, and/or subscriber management), and/or provide support for multiple application services (e.g., data, voice, and video).

In one embodiment, the checksum neutral modification process is implemented by a network device 501 or similar computing device. The network device 501 can have any structure that enables it to receive data traffic and forward it toward its destination. The network device 501 can include a network processor 503 or set of network processors that execute the functions of the network device 501. A 'set,' as used herein, is any positive whole number of items including one item. The network device 501 can execute a checksum neutral modification module 507A, B to implement the functions of reading in a timestamp from a UDP datagram and receiving a current/actual timestamp then outputting a checksum neutral timestamp to be written into the payload of the UDP diagram, as illustrated in FIG. 4. The checksum neutral modification module 507A, B can be implemented at a processor (not illustrated), the network processor 503, in a line card 517 or in a similar location in the network device 501.

The network device 501 connects with separately administered networks that have user equipment and/or content servers. The network processor 503 can implement the checksum neutral modification module 507A as a discrete hardware, software module or any combination thereof. The network processor 503 can also service the routing information base 505A and similar functions related to data traffic forwarding and network topology maintenance. The routing information base 505A can be implemented as match action tables that are utilized for forwarding protocol data units (PDUs) (i.e., packets). The functions of the checksum neutral modification module 507A, B can be implemented as modules in any combination of software, including firmware, and hardware within the network device. The functions of the checksum neutral modification module 507A, B that are executed and implemented by the network device 501 include those described further herein above.

In one embodiment, the network device 501 can include a set of line cards 517 that process and forward the incoming data traffic toward the respective destination nodes by identifying the destination and forwarding the data traffic to the appropriate line card 517 having an egress port that leads to or toward the destination via a next hop. These line cards 517 can also implement the forwarding information base 505B, or a relevant subset thereof. The line cards 517 can also implement or facilitate the checksum neutral modification module 507B functions described herein above. The checksum neutral modification module 507B can be implemented via a L1 processor 513, an optical module, a MAC layer, a PHY layer or similar components that are close to the port or wire over which the communications with the network are implemented such that timestamping and time correction can be implemented as close to the time of receipt or transmission as possible. The line cards 517 are in communication with one another via a switch fabric 511 and communicate with other nodes over attached networks 521 using Ethernet, fiber optic or similar communication links and media.

The operations of the flow diagrams have been described with reference to the exemplary embodiment of the block diagrams. However, it should be understood that the operations of the flowcharts could be performed by embodiments of the invention other than those discussed, and the embodiments discussed with reference to block diagrams can perform operations different from those discussed with reference to the flowcharts. While the flowcharts show a particular order of operations performed by certain embodiments, it should be understood that such order is exemplary (e.g., alternative embodiments may perform the operations in a different order, combine certain operations, overlap certain operations, etc.).

As described herein, operations performed by the network device 501 may refer to specific configurations of hardware such as application specific integrated circuits (ASICs) configured to perform certain operations or having a predetermined functionality, or software instructions stored in memory embodied in a non-transitory computer readable storage medium. Thus, the techniques shown in the figures can be implemented using code and data stored and executed on one or more electronic devices (e.g., an end station, a network element). Such electronic devices store and communicate (internally and/or with other electronic devices over a network) code and data using computer-readable media, such as non-transitory computer-readable storage media (e.g., magnetic disks; optical disks; random access memory; read only memory; flash memory devices; phase-change memory) and transitory computer-readable communication media (e.g., electrical, optical, acoustical or other form of propagated signals—such as carrier waves, infrared signals, digital signals). In addition, such electronic devices typically include a set of one or more processors coupled to one or more other components, such as one or more storage devices (non-transitory machine-readable storage media), user input/output devices (e.g., a keyboard, a touchscreen, and/or a display), and network connections. The coupling of the set of processors and other components is typically through one or more busses and bridges (also termed as bus controllers). Thus, the storage device of a given electronic device typically stores code and/or data for execution on the set of one or more processors of that electronic device. One or more parts of an embodiment of the invention may be implemented using different combinations of software, firmware, and/or hardware.

An electronic device stores and transmits (internally and/or with other electronic devices over a network) code (which is composed of software instructions and which is sometimes referred to as computer program code or a computer program) and/or data using machine-readable media (also called computer-readable media), such as machine-readable storage media (e.g., magnetic disks, optical disks, read only memory (ROM), flash memory devices, phase change memory) and machine-readable transmission media (also called a carrier) (e.g., electrical, optical, radio, acoustical or other form of propagated signals—such as carrier waves, infrared signals). Thus, an electronic device (e.g., a computer) includes hardware and software, such as a set of one or more processors coupled to one or more machine-readable storage media to store code for execution on the set of processors and/or to store data. For instance, an electronic device may include non-volatile memory containing the code since the non-volatile memory can persist code/data even when the electronic device is turned off (when power is removed), and while the electronic device is turned on that part of the code that is to be executed by the processor(s) of that electronic device is typically copied from the slower non-volatile memory into volatile memory (e.g., dynamic random access memory (DRAM), static random access memory (SRAM)) of that electronic device. Typical electronic devices also include a set of one or more physical network interface(s) to establish network connections (to transmit and/or receive code and/or data using propagating signals) with other electronic devices. One or more parts of an embodiment of the invention may be implemented using different combinations of software, firmware, and/or hardware.

Some portions of the preceding detailed descriptions have been presented in terms of algorithms and symbolic representations of transactions on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of transactions leading to a desired result. The transactions are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The algorithms and displays presented herein are not inherently related to any particular computer or other apparatus. Various general-purpose systems may be used with programs in accordance with the teachings herein, or it may prove convenient to construct more specialized apparatus to perform the required method transactions. The required structure for a variety of these systems will appear from the description above. In addition, embodiments of the present invention are not described with reference to any particular programming language. It will be appreciated that a variety of programming languages may be used to implement the teachings of embodiments of the invention as described herein.

In the foregoing specification, embodiments of the invention have been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

Throughout the description, embodiments of the present invention have been presented through flow diagrams. It will be appreciated that the order of transactions and transactions described in these flow diagrams are only intended for illustrative purposes and not intended as a limitation of the present invention. One having ordinary skill in the art would recognize that variations can be made to the flow diagrams without departing from the broader spirit and scope of the invention as set forth in the following claims.

What is claimed is:

1. A method implemented by a network device in a network including a plurality of network devices, the method for modifying a timestamp in a packet that is a timing protocol packet that is encapsulated by a user data protocol (UDP) datagram without a checksum trailer, where the modified timestamp is written into the packet, but does not require a checksum of the UDP datagram to be changed, the method comprising:
   receiving a packet including a first timestamp over the network;
   receiving the first timestamp from the packet and a second timestamp to be written to the packet;
   determining a third timestamp that is a modification of the second timestamp to be written to the packet, the third timestamp having least significant bits modified from the second timestamp such that the checksum of the UDP datagram is unchanged, wherein determining the third timestamp includes generating a set of possible modifications to the second timestamp, and selecting for the third timestamp a modification from the set of possible modifications having the least deviation from the second timestamp;
   writing the third timestamp into the packet in place of the second timestamp; and
   transmitting the UDP datagram to the network.

2. The method of claim 1, wherein the timing protocol packet is a precision time protocol (PTP), a network timing protocol (NTP), a one way active measurement protocol (OWAMP), or a two way active measurement protocol (TWAMP) packet.

3. The method of claim 1, wherein determining the third timestamp further comprises:
   modifying a set of least significant bits in the second timestamp to offset a value of the most significant bits in the second timestamp.

4. The method of claim 1, further comprising:
   comparing the first timestamp to the second timestamp to determine a difference; and
   modifying the second timestamp to offset the difference to maintain the checksum of the UDP datagram.

5. The method of claim 1, wherein the third timestamp is written into the packet in the location of the first timestamp in the packet.

6. The method of claim 5, wherein the location of the first timestamp is in the timing protocol packet in a payload of the UDP datagram.

7. A network device in a network including a plurality of network devices, the network device implementing a method for modifying a timestamp in a packet that is a timing protocol packet that is encapsulated by a user data protocol (UDP) datagram without a checksum trailer, where the modified timestamp is written into the packet, but does not require a checksum of the UDP datagram to be changed, the network device comprising:
   a machine-readable storage medium;
   a processor coupled to the machine-readable storage medium, the processor configured to receive the UDP datagram from the network, to receive the first timestamp from the packet in the UDP datagram and a second timestamp to be written to the packet, to write a third timestamp into the packet in the UDP datagram in place of the second timestamp, and to transmit the UDP datagram to the network; and
   a checksum neutral modification module coupled to the processor and the machine-readable storage medium, the checksum neutral modification module configured to determine the third timestamp that is a modification of the second timestamp to be written to the packet, the third timestamp having least significant bits modified from the second timestamp such that the checksum of the UDP datagram is unchanged, wherein the checksum neutral modification module is further to determine the third timestamp by generating a set of possible modifications to the second timestamp, and selecting for the third timestamp a modification from the set of possible modifications having the least deviation from the second timestamp.

8. The network device of claim 7, wherein the timing protocol packet is a precision time protocol (PTP), a network timing protocol (NTP), a one way active measurement protocol (OWAMP), or a two way active measurement protocol (TWAMP) packet.

9. The network device of claim 7, wherein the checksum neutral modification module is further configured to determine the third timestamp by modifying a set of least significant bits in the second timestamp to offset a value of the most significant bits in the second timestamp.

10. The network device of claim 7, wherein the checksum neutral modification module is further configured to compare the first timestamp to the second timestamp to determine a difference, and to modify the second timestamp to offset the difference to maintain the checksum of the UDP datagram.

11. The network device of claim 7, wherein the third timestamp is written into the packet in the location of the first timestamp in the packet.

12. The network device of claim 11, wherein the checksum neutral modification module is implemented in a line card, a physical layer, a media access control (MAC) layer, an optical module or the processor.

13. A non-transitory machine-readable medium having stored therein a set of instructions, which when executed by a network device, in a network of a plurality of network devices, implement a method for modifying a timestamp in a packet that is a timing protocol packet that is encapsulated by a user data protocol (UDP) datagram without a checksum trailer, where the modified timestamp is written into the packet, but does not require a checksum of the UDP datagram to be changed, the set of instructions comprising:

receiving a packet including a first timestamp over the network;

receiving the first timestamp from the packet and a second timestamp to be written to the packet;

determining a third timestamp that is a modification of the second timestamp to be written to the packet, the third timestamp having least significant bits modified from the second timestamp such that the checksum of the UDP datagram is unchanged, wherein determining the third timestamp includes generating a set of possible modifications to the second timestamp, and selecting for the third timestamp a modification from the set of possible modifications having the least deviation from the second timestamp;

writing the third timestamp into the packet instead of the second timestamp; and transmitting the UDP datagram to the network.

14. The non-transitory machine readable medium of claim 13, wherein the timing protocol packet is a precision time protocol (PTP), a network timing protocol (NTP), a one way active measurement protocol (OWAMP), or a two way active measurement protocol (TWAMP) packet.

15. The non-transitory machine readable medium of claim 13, wherein determining the third timestamp further comprises:

modifying a set of least significant bits in the second timestamp to offset a value of the most significant bits in the second timestamp.

16. The non-transitory machine readable medium of claim 13, further comprising:

comparing the first timestamp to the second timestamp to determine a difference; and modifying the second timestamp to offset the difference to maintain the checksum of the UDP datagram.

17. The non-transitory machine readable medium of claim 13, wherein the third timestamp is written into the packet in the location of the first timestamp in the packet.

18. The non-transitory machine readable medium of claim 17, wherein the location of the first timestamp is in the timing protocol packet in a payload of the UDP datagram.

* * * * *